(12) United States Patent
Miller et al.

(10) Patent No.: US 8,902,091 B1
(45) Date of Patent: Dec. 2, 2014

(54) SYSTEM AND METHOD FOR HIGH SPEED DATA PARALLELIZATION FOR AN N-PHASE RECEIVER

(71) Applicant: Avago Technologies General IP (Singapore) Pte. Ltd., Singapore (SG)

(72) Inventors: Darrin C. Miller, Fort Collins, CO (US); Jade Michael Kizer, Windsor, CO (US); Peter J. Meier, Fort Collins, CO (US); Gilbert Yoh, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/016,279

(22) Filed: Sep. 3, 2013

(51) Int. Cl.
  *H03M 9/00* (2006.01)
(52) U.S. Cl.
  CPC ........................................ *H03M 9/00* (2013.01)
  USPC .......................................... 341/100; 341/101
(58) Field of Classification Search
  CPC ............................... H03M 9/00; H04J 3/0047
  USPC .................................................. 341/100, 101
  See application file for complete search history.

(56) References Cited

U.S. PATENT DOCUMENTS

| | | | |
|---|---|---|---|
| 6,768,431 B2 * | 7/2004 | Chiang .......................... | 341/100 |
| 6,911,923 B1 * | 6/2005 | Wang et al. .................... | 341/100 |
| 7,064,690 B2 * | 6/2006 | Fowler et al. .................. | 341/101 |
| 7,221,713 B2 * | 5/2007 | Taghizadeh-Kaschani .. | 375/259 |
| 7,308,048 B2 | 12/2007 | Wei | |
| 7,675,439 B2 * | 3/2010 | Chang et al. ................... | 341/100 |
| 7,715,501 B2 | 5/2010 | Stojanovic et al. | |
| 7,920,079 B2 * | 4/2011 | Tsubota et al. ............... | 341/100 |

OTHER PUBLICATIONS

Chung; Design Considerations for High-Speed Backplane Transceivers with Digital Adaptive Equalizers_Thesis; Harvard University School of Engineering and Applied Sciences, pp. 1-148; 2009.
Yuan; An area-power efficient 4-PAM full-clock 10-Gb/s CMOS pre-emphasis serial link transmitter; Analog Integrated Circcuit Signal Processing; 59:257-264; 2008.

* cited by examiner

*Primary Examiner* — Khai M Nguyen

(57) ABSTRACT

A serial-to-parallel converter includes a first register bank having first and second register groups, the first register bank configured to receive a communication signal having at least one bit for each unit interval (UI) of a system clock signal, the first register bank having a number of registers corresponding to a number of parallel processing stages, a second register bank having a plurality of register groups, each register group configured to receive the output of at least one of the first and second register groups after a number of unit intervals corresponding to the number of registers in each of the first and second register groups in the first register bank, and a third register bank configured to receive the output of the second register bank after a number of unit intervals corresponding to a number of registers in the second register bank.

23 Claims, 13 Drawing Sheets

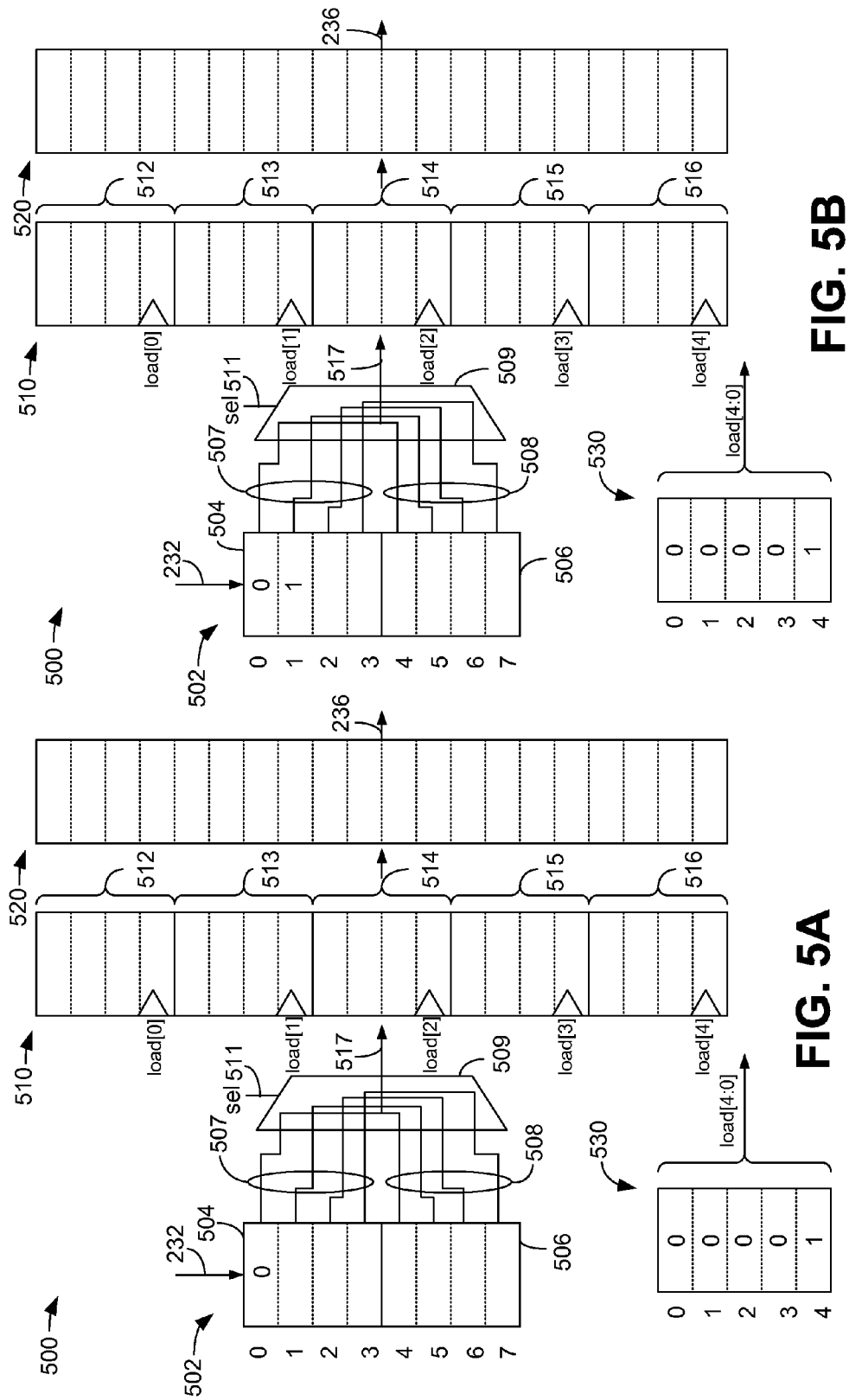

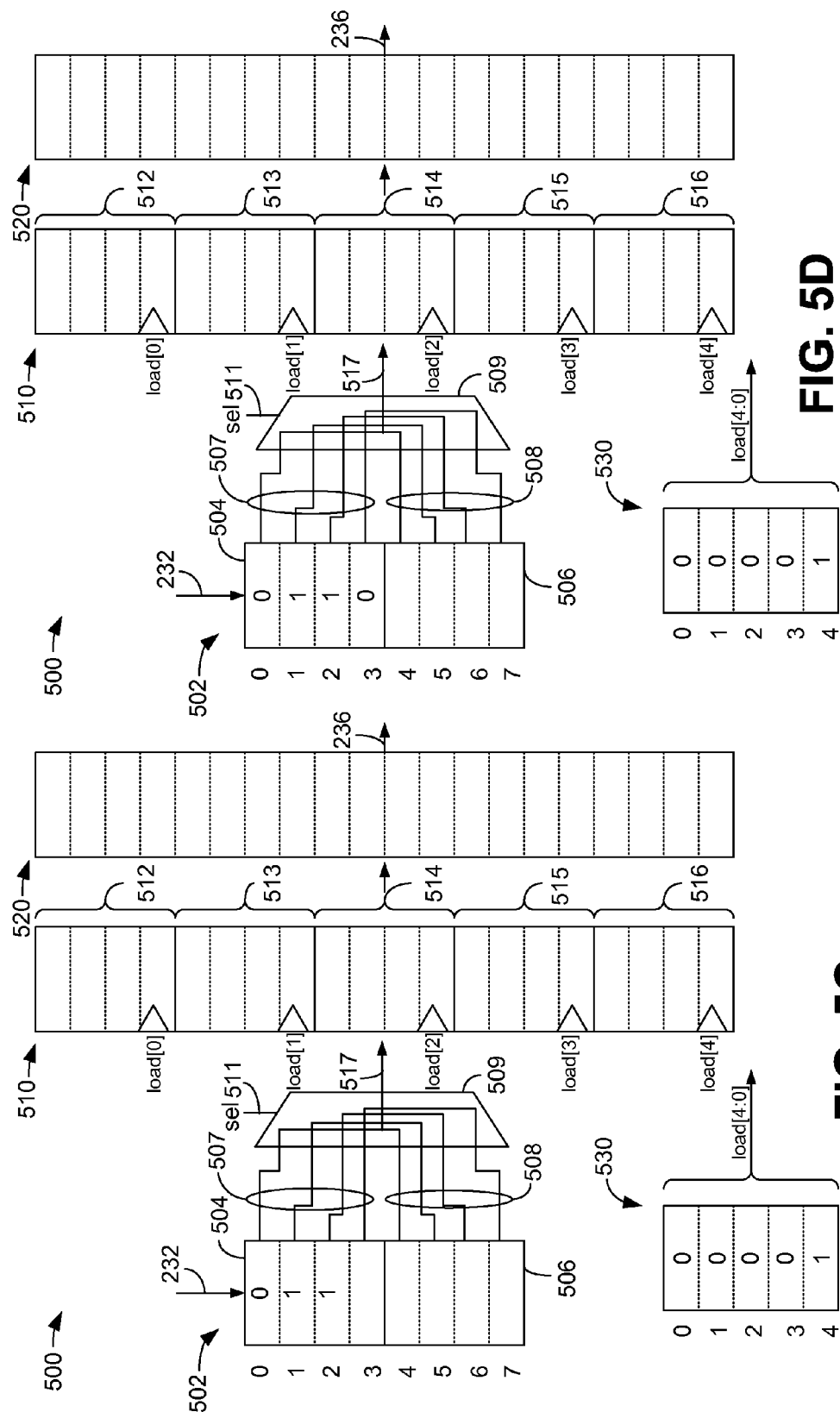

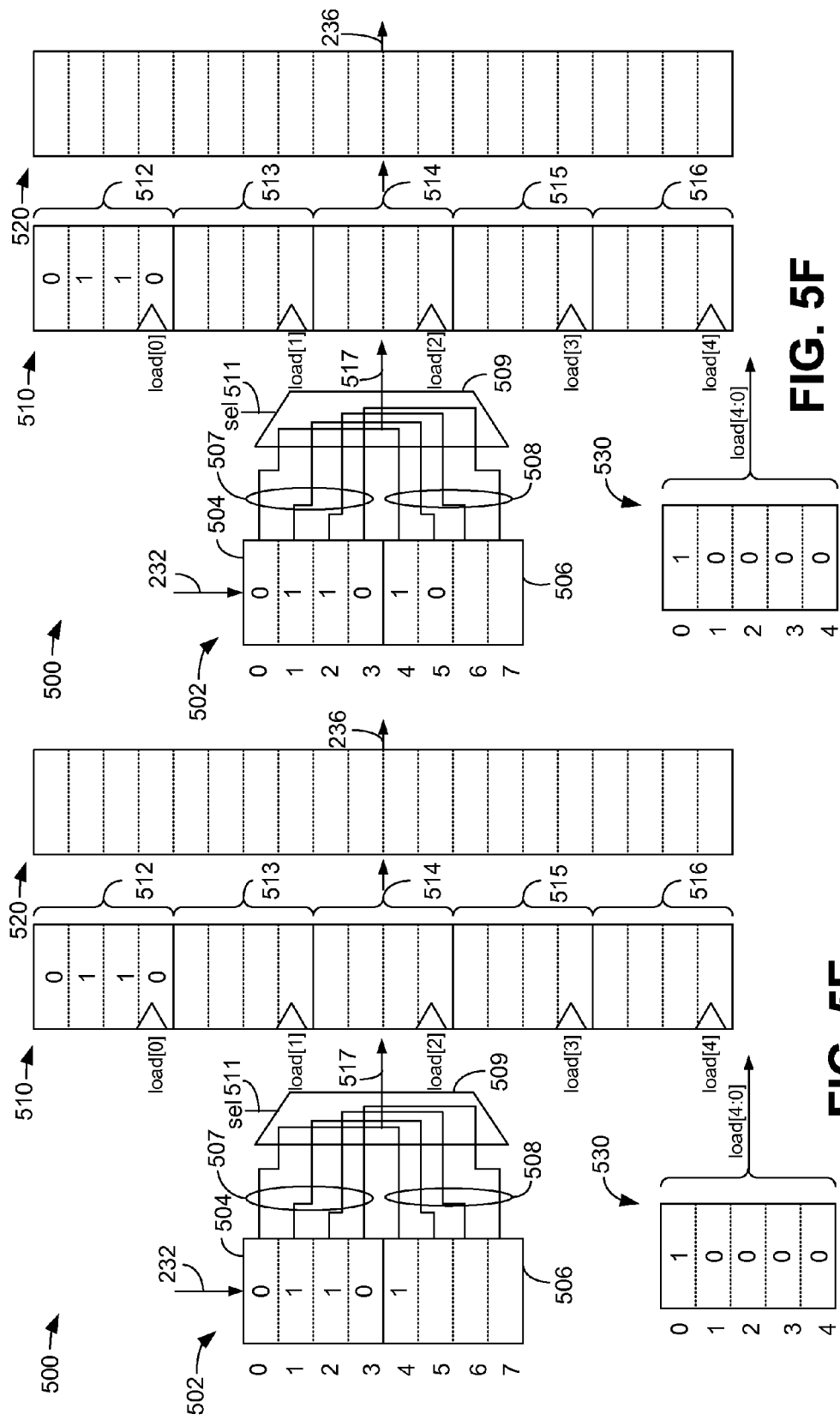

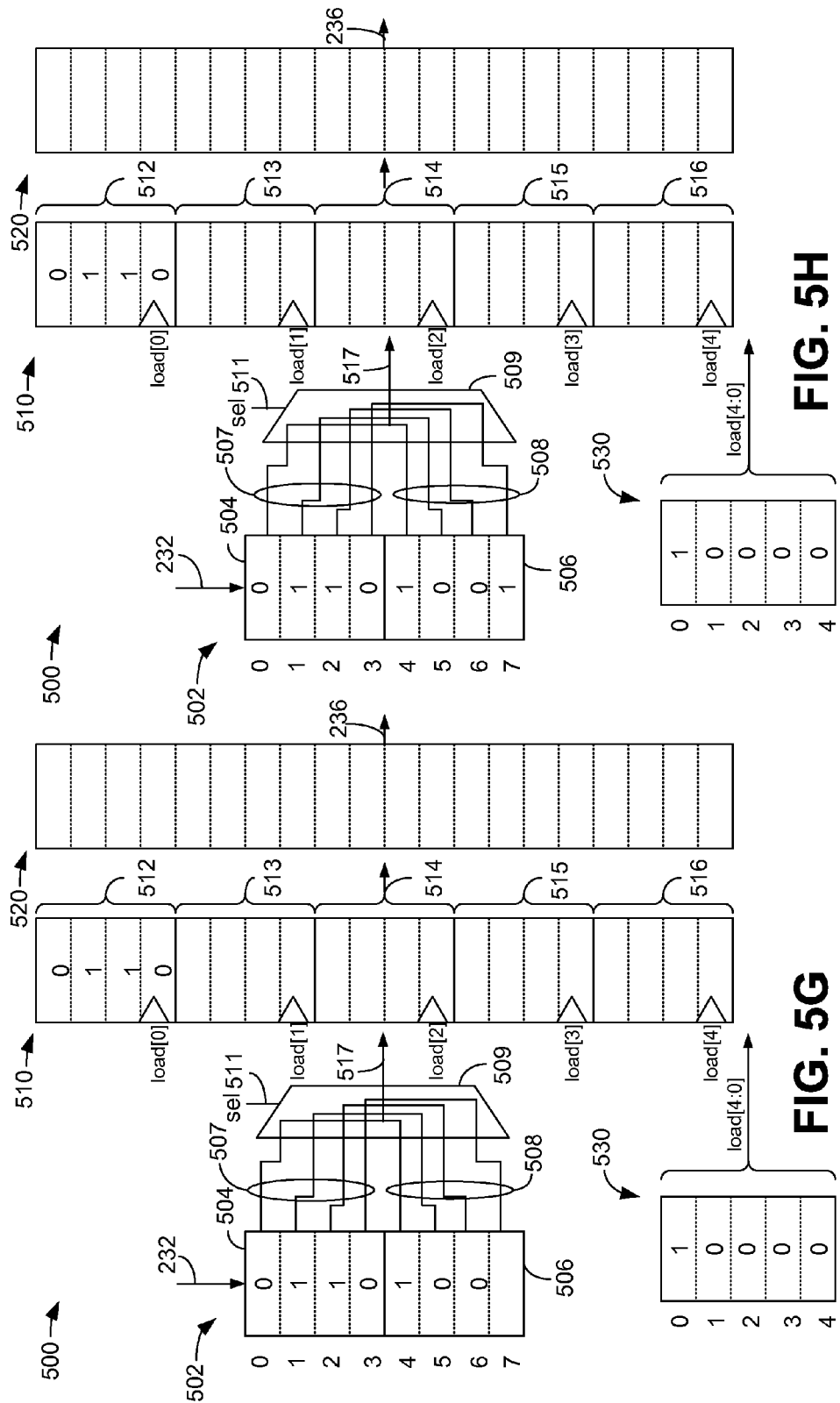

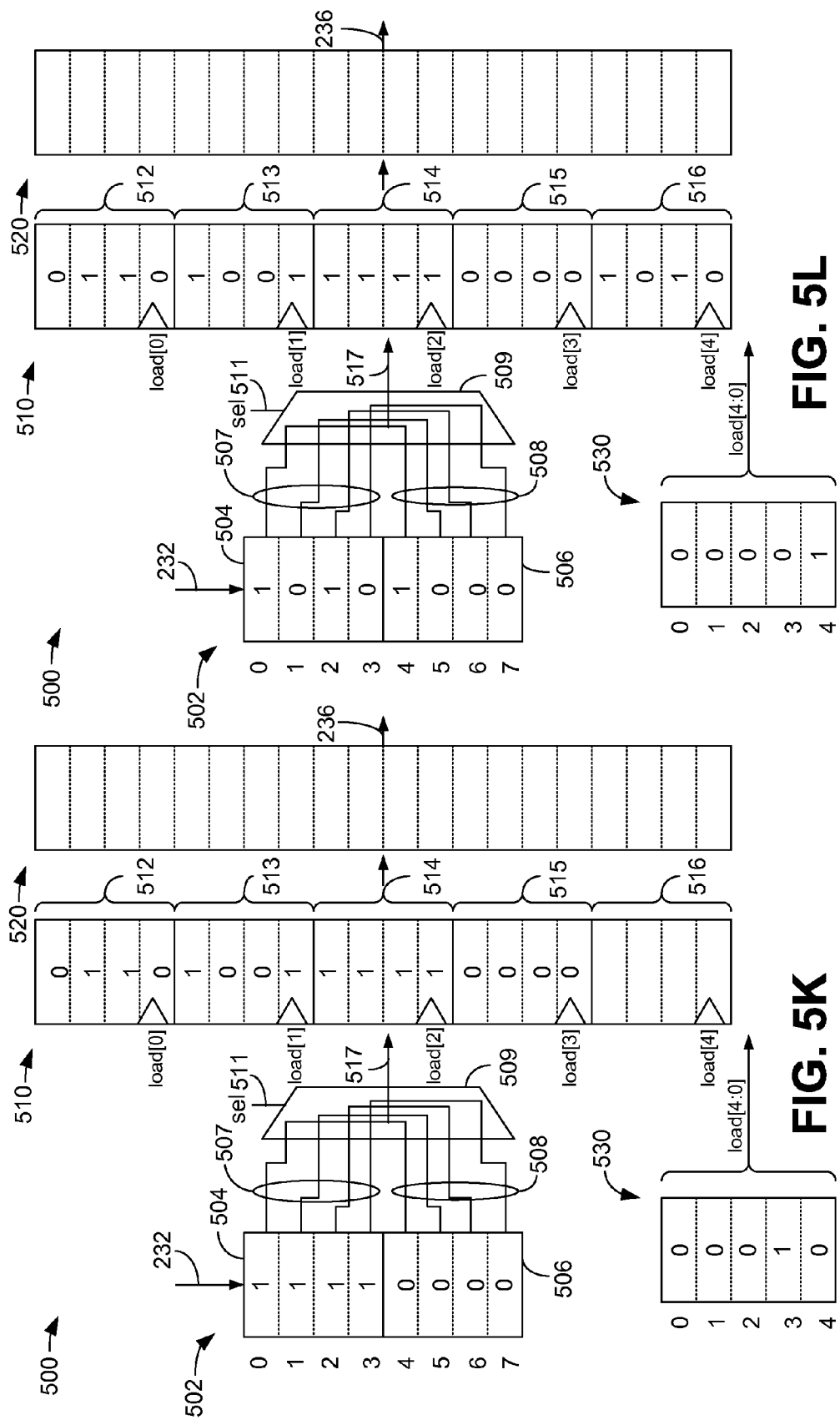

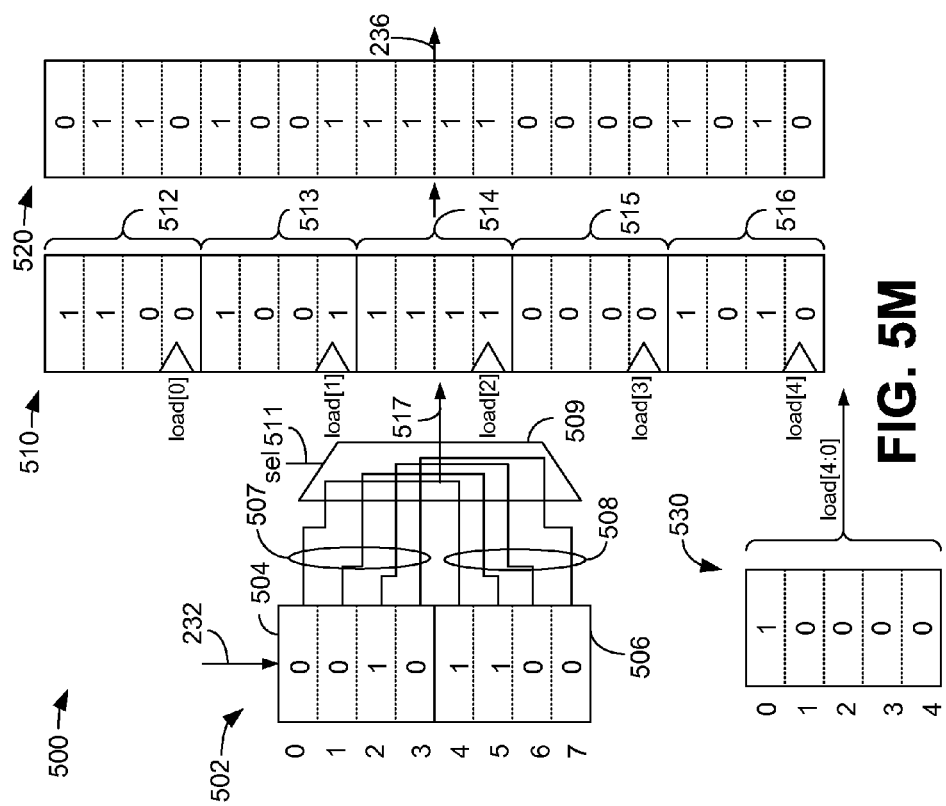

US 8,902,091 B1

SYSTEM AND METHOD FOR HIGH SPEED DATA PARALLELIZATION FOR AN N-PHASE RECEIVER

BACKGROUND

A modern integrated circuit (IC) must meet very stringent design and performance specifications. In many applications for communication devices, transmit and receive signals are exchanged over communication channels. These communication channels include impairments that affect the quality of the signal that traverses them. One type of IC that uses both a transmit element and a receive element is referred to as a serializer/deserializer (SERDES). The transmit element on a SERDES typically sends information to a receiver on a different SERDES over a communication channel. One of the functions of the receiver is to convert a high-speed serial data stream to a lower speed parallel data stream, thus providing the "deserializer" functionality.

The "deserializer" functionality is performed by a serial-to-parallel converter, which uses a high-speed clock signal to perform the data parallelization. For example, in an existing SERDES system operating at a data rate of 28 gigabits per second (Gbps) or higher, a clock operating at 14 gigahertz (GHz) (referred to as an "F2" clock, with an "F1" clock operating at 28 GHz), was typically used to convert the data (also operating at 14 GHz) from a serial stream to multiple parallel data streams. Unfortunately, routing and gating a clock operating at 14 GHz is difficult and consumes a large amount of power.

Data parallelization becomes even more challenging when attempting to design and fabricate a receiver that can operate using both PAM 2 and PAM 4 modalities. The acronym PAM refers to pulse amplitude modulation, which is a form of signal modulation where the message information is encoded into the amplitude of a series of signal pulses. PAM is an analog pulse modulation scheme in which the amplitude of a train of carrier pulses is varied according to the sample value of the message signal. A PAM 2 communication modality refers to a modulator that takes one bit at a time and maps the signal amplitude to one of two possible levels (two symbols), for example −1 volt and 1 volt. A PAM 4 communication modality refers to a modulator that takes two bits at a time and maps the signal amplitude to one of four possible levels (four symbols), for example −3 volts, −1 volt, 1 volt, and 3 volts. For a given baud rate, PAM 4 modulation can transmit up to twice the number of bits as PAM 2 modulation.

Therefore, it would be desirable to be able to deserialize a high-speed serial data stream using a lower clock speed that is useful for both PAM 2 and PAM 4 modalities.

SUMMARY

In an embodiment, a serial-to-parallel converter comprises a first register bank having first and second register groups, the first register bank configured to receive a communication signal having at least one bit for each unit interval (UI) of a system clock signal, the first register bank having a number of registers corresponding to a number of parallel processing stages, a second register bank having a plurality of register groups, each register group configured to receive the output of at least one of the first and second register groups after a number of unit intervals corresponding to the number of registers in each of the first and second register groups in the first register bank, and a third register bank configured to receive the output of the second register bank after a number of unit intervals corresponding to a number of registers in the second register bank.

Other embodiments are also provided. Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 5A through 5M are a series of schematic diagrams illustrating the progression of a data pattern through a register arrangement in accordance with the system and method for high speed data parallelization for an N-phase receiver.

DETAILED DESCRIPTION

A system and method for high speed data parallelization for an N-phase receiver can be implemented in any integrated circuit (IC) that uses a digital direct conversion receiver (DCR) to receive a communication signal over a communication channel. In an embodiment, the system and method for high speed data parallelization for an N-phase receiver is implemented in a serializer/deserializer (SERDES) receiver operating at a 50 gigabit per second (Gbps) data rate by implementing a pulse amplitude modulation (PAM) 4 modulation methodology operating at 25 GBaud (Gsymbols per second). The 50 Gbps data rate is enabled, at least in part, by the pipelined implementation to be described below, and is backward compatible with PAM 2 modulation methodologies operating at a data rate of 25 Gbps.

Figure 1:
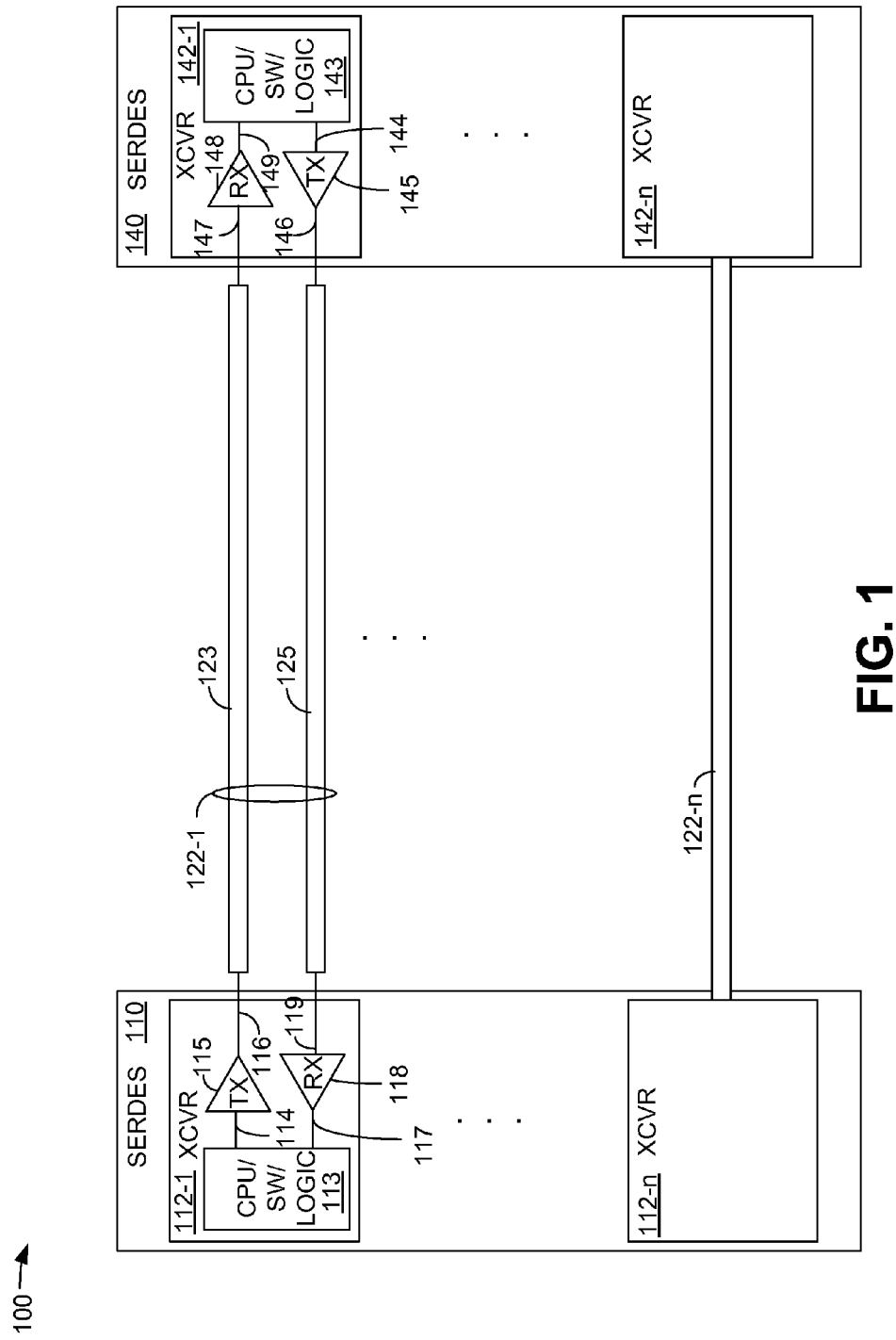
FIG. 1 is a schematic view illustrating an example of a communication system in which the system and method for high speed data parallelization for an N-phase receiver can be implemented.

FIG. 1 is a schematic view illustrating an example of a communication system 100 in which the system and method for high speed data parallelization for an N-phase receiver can be implemented. The communication system 100 is an example only of one possible implementation. The communication system 100 comprises a serializer/deserializer (SERDES) 110 that includes a plurality of transceivers 112. Only one transceiver 112-1 is illustrated in detail, but it is understood that many transceivers 112-n can be included in the SERDES 110.

The transceiver 112-1 comprises logic 113, which includes the functionality of a central processor unit (CPU), software (SW) and general logic, and will be referred to as "logic" for simplicity. It should be noted that the depiction of the transceiver 112-1 is highly simplified and intended to illustrate only the basic components of a SERDES transceiver.

The transceiver 112-1 also comprises a transmitter 115 and a receiver 118. The transmitter 115 receives an information signal from the logic 113 over connection 114 and provides a transmit signal over connection 116. The receiver 118 receives an information signal over connection 119 and provides a processed information signal over connection 117 to the logic 113.

The system 100 also comprises a SERDES 140 that includes a plurality of transceivers 142. Only one transceiver 142-1 is illustrated in detail, but it is understood that many transceivers 142-n can be included in the SERDES 140.

The transceiver 142-1 comprises a logic element 143, which includes the functionality of a central processor unit (CPU), software (SW) and general logic, and will be referred to as "logic" for simplicity. It should be noted that the depiction of the transceiver 142-1 is highly simplified and intended to illustrate only the basic components of a SERDES transceiver.

The transceiver 142-1 also comprises a transmitter 145 and a receiver 148. The transmitter 145 receives an information signal from the logic 143 over connection 144 and provides a transmit signal over connection 146. The receiver 148 receives an information signal over connection 147 and provides a processed information signal over connection 149 to the logic 143.

The transceiver 112-1 is connected to the transceiver 142-1 over a communication channel 122-1. A similar communication channel 122-n connects the "n" transceiver 112-n to a corresponding "n" transceiver 142-n.

In an embodiment, the communication channel 122-1 can comprise communication paths 123 and 125. The communication path 123 can connect the transmitter 115 to the receiver 148 and the communication path 125 can connect the transmitter 145 to the receiver 118. The communication channel 122-1 can be adapted to a variety of communication methodologies including, but not limited to, single-ended, differential, or others, and can also be adapted to carry a variety of modulation methodologies including, for example, PAM 2, PAM 4 and others. In an embodiment, the receivers and transmitters operate on differential signals. Differential signals are those that are represented by two complementary signals on different conductors, with the term "differential" representing the difference between the two complementary signals. The two complementary signals can be referred to as the "true" or "t" signal and the "complement" or "c" signal. All differential signals also have what is referred to as a "common mode," which represents the average of the two differential signals. High-speed differential signaling offers many advantages, such as low noise and low power while providing a robust and high-speed data transmission.

Figure 2:
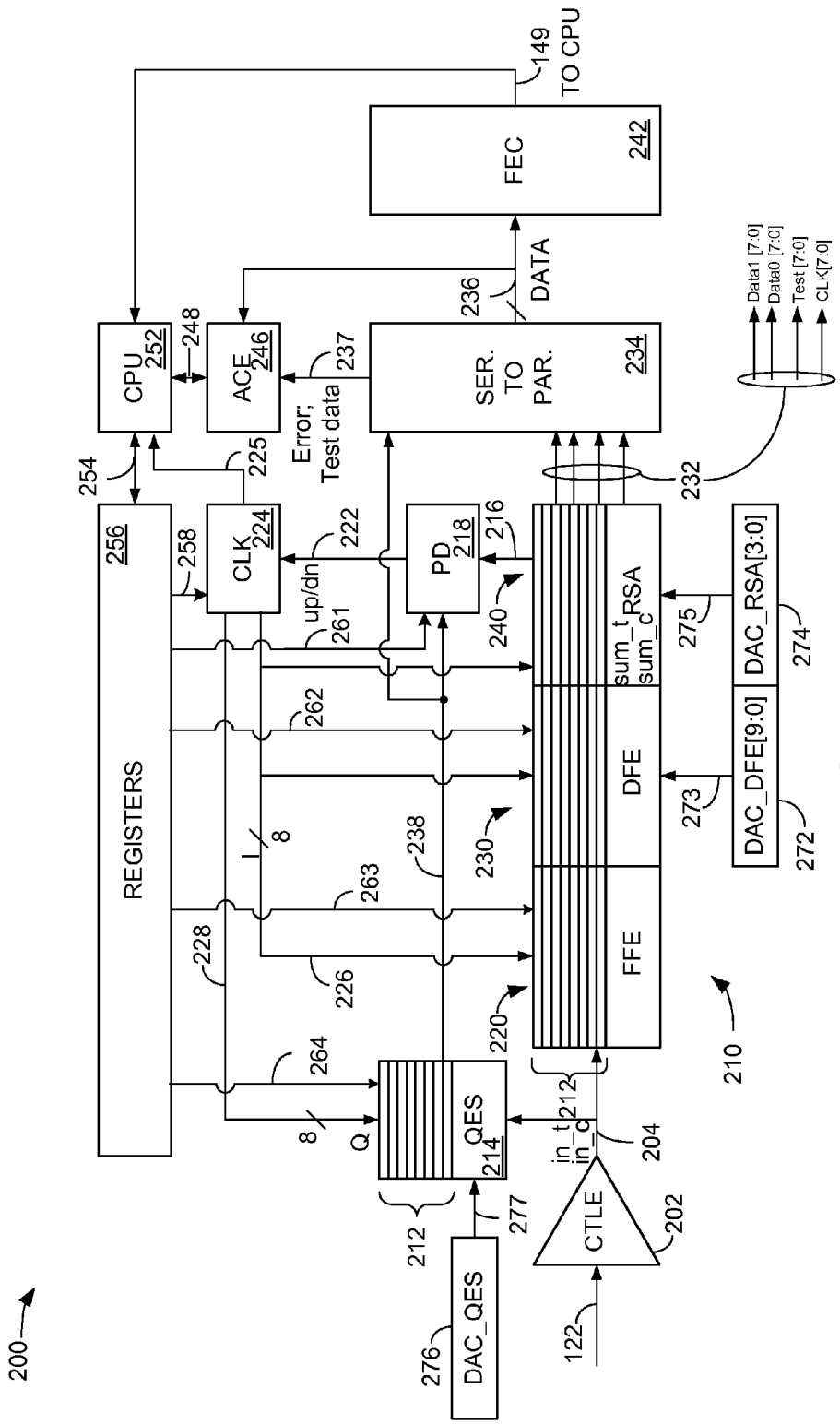
FIG. 2 is a schematic diagram illustrating an example receiver of FIG. 1.

FIG. 2 is a schematic diagram illustrating an example receiver of FIG. 1. The receiver 200 can be any of the receivers illustrated in FIG. 1. The receiver 200 comprises a continuous time linear equalizer (CTLE) 202 that receives the information signal from the communication channel 122 (FIG. 1). The output of the CTLE 202 is provided to a quadrature edge selection (QES) element 214 and to a pipelined processing system 210. The pipelined processing system 210 comprises a pipelined feed forward equalizer (FFE) 220, a pipelined decision feedback equalizer (DFE) 230 and a regenerative sense amplifier (RSA) 240.

The reference to a "pipelined" processing methodology refers, in this embodiment, to the ability of the FFE 220, the DFE 230 and the RSA 240 to process 8 pipelined stages 212 (referred to as sections D0 through D7) simultaneously. In an embodiment, each pipelined stage in the pipelined processing system 210 operates on an F8-based clock, operating at 3.5 GHz.

The DFE 230 receives a threshold voltage input from a digital-to-analog converter (DAC) 272 over connection 273. The RSA 240 receives a threshold voltage input from a digital-to-analog converter (DAC) 274 over connection 275. The DAC 272 and the DAC 274 can be can be any type of DAC that can supply a threshold voltage input based on system requirements. In an embodiment, a single DAC 272 can be shared across the pipelined stages of the DFE 230, thus reducing cost and maximizing processing efficiency.

The RSA 240 converts an analog voltage into a complementary digital value. The output of the RSA 240 comprises data and in-phase pulse edge information and is provided over connection 216 to a phase detector (PD) 218. The output of the phase detector 218 comprises an update signal having, for example, an up/down command, and is provided over connection 222 to a clock (CLK) element 224. The clock element 224 is also referred to as an N-phase clock generation circuit, and provides an in-phase (I) clocking signal over connection 226 and provides a quadrature (Q) clocking signal over connection 228. The in-phase (I) clocking signal is provided to the pipelined FFE 220, the DFE 230, and to the RSA 240; and the quadrature (Q) clocking signal is provided to the QES element 214.

The QES element 214 receives a threshold voltage input from a DAC 276 over connection 277. The DAC 276 can be any type of DAC that can supply a threshold voltage input based on system requirements.

The output of the RSA 240 on connection 232 is a digital representation of the raw, high speed signal prior to extracting any line coding, forward error correction, or demodulation to recover data. In the case of PAM 2, the output is a sequence of ones and zeros. In the case of PAM N, it is a sequence of N binary encoded symbols. For example, for PAM 4, the output comprises a string of four distinct symbols each identified by a different two bit digital word. As an example, the signals on connection 232 comprise data, referred to as "Data1[7:0]" and "Data0[7:0]", a test signal referred to as "Test[7:0]" and a clock signal referred to as "CLK[7:0]".

The output of the RSA 240 is provided over connection 232 to a serial-to-parallel converter 234. The serial-to-parallel converter 234 converts the high speed digital data stream on connection 232 to a lower speed bus of parallel data on connection 236. The output of the serial-to-parallel converter 234 on connection 236 is the parallel data signal and is provided to a forward error correction (FEC) element 242. The output of the serial-to-parallel converter 234 on connection 237 is the error, or test, signal (Test[7:0]) and is provided to an automatic correlation engine (ACE) 246. The error, or test, signal is used to drive system parameters to increase signal-to-noise ratio in the receiver 200, and can be generated in several ways. One way is to use samplers inside the QES element 214 to identify zero crossings (also called edge data, or the transition between data bits). Another method is to use auxiliary samplers inside the RSA element 240 to identify the high amplitude signals (equivalent to the open part of an eye diagram). So, for example, using the edge data method, if a sampler inside the QES element 214 began to detect a positive signal where the zero crossing point should occur, then the error signal on connection 237 would increase, and various system parameters could be driven to reduce that error. The output of the FEC 242 is provided over connection 149 to the CPU 252.

The output of the ACE 246 is provided over connection 248 to the CPU 252. The implementation of the ACE 246 could be done with hardware on chip, firmware off chip, or a combination of hardware and firmware, and a CPU, in which case the CPU 252 would read and write to the ACE 246 over connection 248. The ACE 246 compares the received data to a pseudorandom binary sequence (PRBS) pattern and provides a correlation function to support implementation of a least minimum square (LMS) algorithm for tuning the receiver 200.

The CPU 252 is connected over a bi-directional link 254 to registers 256. The registers 256 store DFE filter coefficients, FFE controls, CTLE controls, RSA threshold voltage control offset correction values for the RSA and QES elements, and controls for the DACs.

An output of the registers 256 on connection 261 is provided to the phase detector 218, an output of the registers 256 on connection 262 is provided to the pipelined DFE 230, an output of the registers 256 on connection 263 is provided to the pipelined FFE 220, and an output of the registers 256 on connection 264 is provided to the QES element 214. Although not shown for simplicity of illustration, the registers 256 also provide control outputs to the CTLE 202 and to all the DACs. In an embodiment, the output of the QES element 214 on connection 238 comprises data and quadrature pulse edge information and is provided to the phase detector 218 and the serial-to-parallel converter 234.

The elements in FIG. 2 generally operate based on a system clock signal that runs at a particular frequency, which corresponds to the baud rate of the data channel. A time period, referred to as a unit interval (UI) generally corresponds to a time period of one clock cycle of the system clock. For example, a transceiver could be communicating at 50 Gbps, using PAM4, the baud rate is 25 G baud per second, and one UI would be 40 ps=1/25G.

Generally, a receive signal on connection 204 is applied to an array of FFE/DFE/RSA/QES sections. If an array of N sections is implemented, then each section can process the receive signal at a rate of 1/(UI*N) which significantly relaxes power requirements compared to the standard (un-pipelined) processing.

For example, a 25 Gbaud receive signal could be processed by an array of 8 sections, each section running at 3.125 GHz. The start time for each section is offset by 1 UI from its neighboring section, so that when the outputs from all 8 sections are summed together (signal 232), it is updated at the original 25 Gbaud rate.

Figure 3:
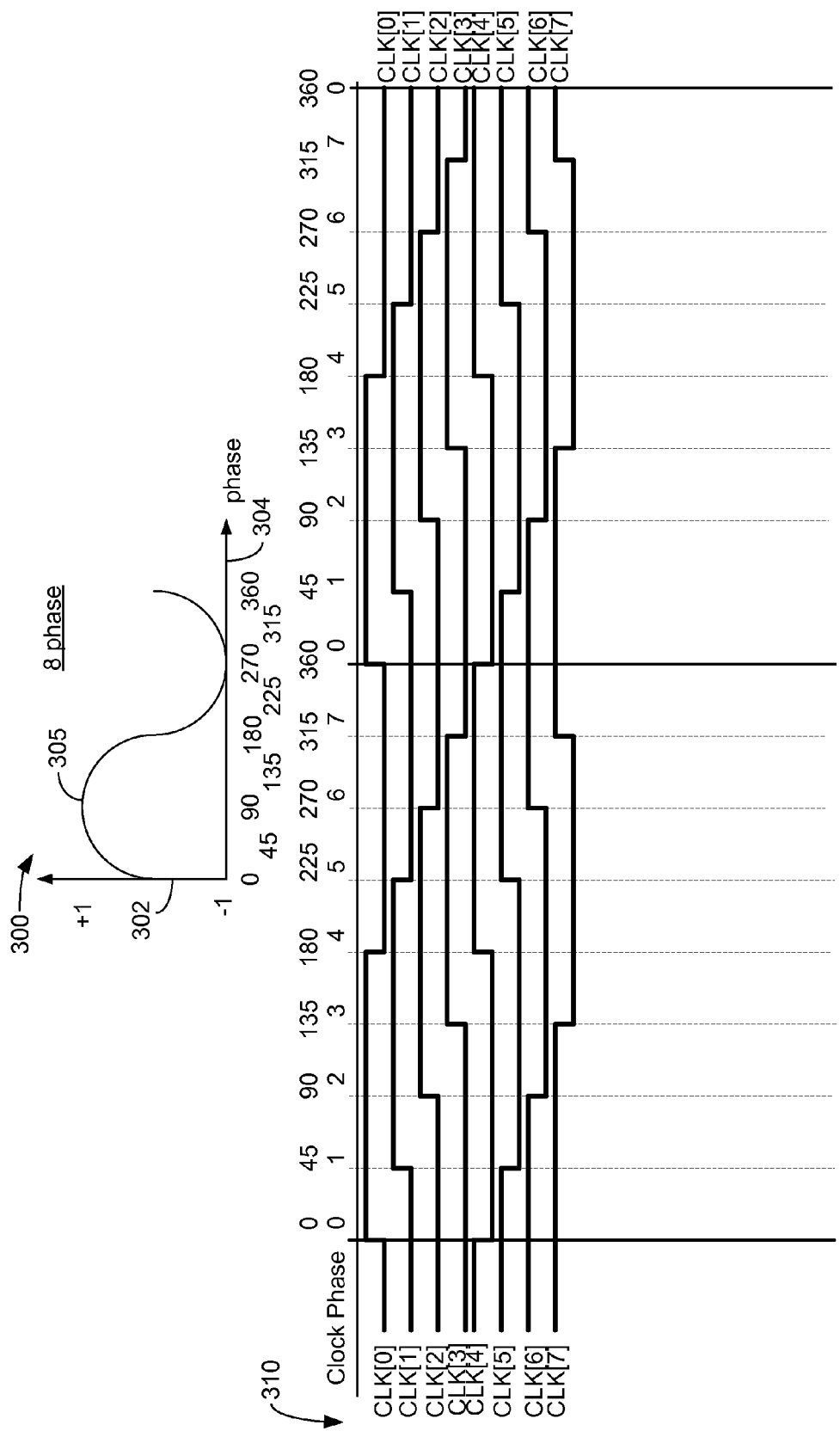
FIG. 3 is a schematic diagram illustrating example clock signals of the receiver of FIG. 2.

FIG. 3 is a schematic diagram illustrating example clock signals of the receiver of FIG. 2. A graphical example of the N-phase clock signal generated by the clock element 224 is shown in the graph 300. The vertical axis 302 of the graph 300 refers to relative amplitude in volts (V), with a normalized value range of between −1V and +1V. The horizontal axis 304 refers to the phase of the clock signal. In an embodiment in which an N-phase receiver is implemented using eight pipelined stages corresponding to (8) clock phases, the clock signal is sampled at 45 degree intervals to generate the 8 clock phases in one clock cycle represented by the trace 305. The 8 clock phases are also shown as signal traces CLK[0] through CLK[7]. The repeating periods "0" through "7" refer to system clock intervals, and the time between each repeating period is referred to as a 'UI' or unit interval of the system clock. Other numbers of phases are possible.

Figures 4A, 4B:
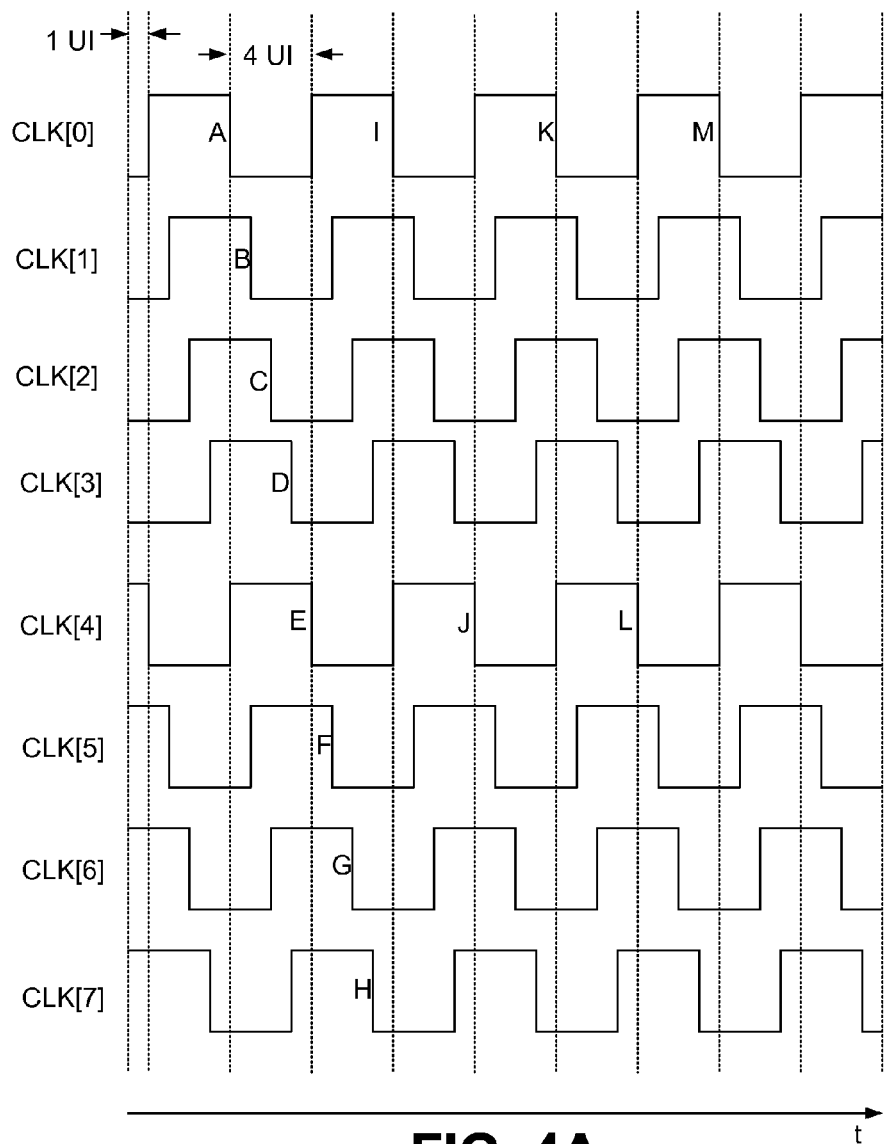
FIG. 4A is a schematic diagram illustrating the example clock signals of FIG. 3 in greater detail.
FIG. 4B is a schematic diagram illustrating an example data pattern.

FIG. 4A is a schematic diagram illustrating the example clock signals of FIG. 3 in greater detail. Each clock signal CLK[0] through CLK[7] transitions from logic low to logic high, or logic high to logic low, every 4 UI, with the successive transition of each clock signal CLK[0] through CLK[7] separated by 1 UI. An example data pattern is also illustrated in FIG. 4B. The progression of the example data pattern through a register arrangement in accordance with the system and method for high speed data parallelization for an N-phase receiver will be shown in greater detail in FIGS. 5A through 5M. Points in time in FIG. 4A that relate to FIGS. 5A through 5M are denoted by the letters "A" through "M." For example, when relating FIG. 4A to FIG. 5A, the transition of the CLK[0] signal referred to using the letter "A" is shown schematically in FIG. 5A. The transition of the CLK[1] signal referred to using the letter "B" is shown schematically in FIG. 5B, and so on.

FIGS. 5A through 5M are a series of schematic diagrams illustrating the progression of the example data pattern 410 of FIG. 4B through a register arrangement in accordance with the system and method for high speed data parallelization for an N-phase receiver.

FIG. 5A is a schematic diagram illustrating a register arrangement 500. The register arrangement 500 is an example of an embodiment of the serial-to-parallel converter 234 of FIG. 2. In an embodiment, the register arrangement 500 comprises a first register bank 502 comprising register groups 504 and 506. Each register group 504 and 506 comprises four (4) registers. Each register is delineated using a dotted line to denote that register group 504 comprises four (4) registers and register group 506 comprises four (4) registers. The registers within the register groups 504 and 506 may also be referred to as "flip-flops" or "flops" as known to those having ordinary skill in the art. In this example, the register groups 504 and 506 each comprise four registers, with the registers in the register group 504 being referred to as "0" through "3" (corresponding to the four bits associated with Data 0[3:0], Data1[3:0] or Test[3:0]) and the registers in the register group 506 being referred to as "4" through "7" (corresponding to the four bits associated with Data 0[7:4], Data1[7:4] or Test[7:4]).

The data and clock signals on connection 232 (FIG. 2) arrive at the registers in pairs. Using Data1[7:0] for example only, and equally applicable to Data0[7:0] and Test[7:0], the rising edge of CLK[0] arrives at the register "0" at the same time that the data signal, Data1[0], changes state (shown in FIG. 6). The registers in the register groups 504 and 506 are triggered by the falling edge of the clock (CLK[0] in this case) leaving ample setup and hold time (shown in FIG. 6). Likewise, at a time of one (1) UI later, the clock signal, CLK[1] and the data signal, Data1[1], arrive at the register "1" together. At a time of one (1) UI later, the clock signal, CLK[2] and the data signal Data1[2] arrive at register "2" and so on until eight bits of data occupy registers "0" through "7" in the register groups 504 and 506. This is also shown in FIG. 4B using exemplary data pattern 410. Alternatively, the signals Data0[7:0] or Test[7:0] may be loaded into the register groups 504 and 506.

A multiplexer 509 is configured to receive the output of the register group 504 on connection 507, and the output of the register group 506 on connection 508. The multiplexer 509 comprises four (4) multiplexers with a first multiplexer configured to receive and select between the output of registers "0" and "4", a second multiplexer configured to receive and select between the output of registers "1" and "5", a third multiplexer configured to receive and select between the output of registers "2" and "6", and a fourth multiplexer configured to receive and select between the output of registers "3" and "7." The four (4) multiplexers within the multiplexer 509 are schematically illustrated using lines to connect the registers "0" through "7" as described above for simplicity of illustration. The multiplexer 509 receives a "select" signal over connection 511.

In this embodiment, the register arrangement 500 also comprises a register bank 510. The register bank 510 comprises five (5) groups of four (4) registers, with the register groups referred to as 512, 513, 514, 515 and 516, with each register being delineated using a dotted line to denote that each register group 512, 513, 514, 515 and 516 comprises four (4) registers. Each register group 512, 513, 514, 515 and 516 comprises four (4) register locations, similar to the registers 504 and 506 described above.

A register bank 530 comprises one group of five registers arranged in what is referred to as a one-hot configuration. Each register in the register bank 530 is delineated using a dotted line to denote that the register group 530 comprises five (5) registers. The term "one-hot" refers to a register arrangement in which one and only one bit in the register bank 530 is logic high at a given time while all other bits are logic low. The term "one-hot" is known to those having ordinary skill in the art. The output of register bank 530 is a signal bus "load[4:0]" which controls which register group within the register bank 510 is updated with the data on connection 517, which is connected to and represents the output of the four multiplexers within the multiplexer 509. The single high value is passed from load[0] to load[1] to load[2] to load[3] to load[4] and then back to load[0] as shown in FIGS. 5A through 5M.

In this embodiment, the register arrangement 500 also comprises a register bank 520. The register bank 520 comprises one (1) group of twenty (20) registers, with each register being delineated using a dotted line to denote that the register bank 520 comprises twenty (20) registers.

As mentioned above, in an 8 phase embodiment, the eight bits of data associated with the eight clock signals that are offset by one UI are provided to the register 502 over connection 232. In this example, any of the Data0[7:0], Data1[7:0], or Test[7:0] data signals (FIG. 2) can be provided over connection 232. Although occurring on separate conductors, the eight bits of data on connection 232 are considered "serial" data and are "parallelized" or "decelerated" to a 20 bit parallel word on connection 236 as the data progresses through the register arrangement 500. Using an exemplary Data1[7:0] signal on connection 232, each bit, n, is delayed by one (1) UI compared to bit n-1. For example, using FIG. 4A and FIG. 6 for timing reference, if Data1[0] arrives at time 0 UI, then Data1[1] arrives with CLK[1] at time 1 UI, Data1[2] arrives with CLK[2] at time 2 UI, etc. Therefore, each of the Data1 [7:0] signals arrives on a separate conductor, separated in time by one (1) UI such that the serial-to-parallel converter 234 is "deserializing" or "decelerating" the serial signals on connection 232 to 8 bits (register bank 502) and then to 20 bits (register bank 520). In an embodiment, the speed of the data on connection 232 corresponds to a clock operating at 3.5 GHz (⅛ of a 28 GHz clock), which is referred to as an "F8" clock and the speed of the data on connection 236 corresponds to a clock operating at 1.4 GHz, which is referred to as an "F20" clock. As an example, while an "F8" clock runs at 3.5 GHz and an F20 clock runs at 1.4 GHz, the speed of the data is determined by the rate at which the data changes, which can be for example, on each rising (or falling) edge of the clock signal (i.e., data is at ½ clock speed), on every other rising (or falling) edge of the clock signal (i.e., data is at ¼ clock speed), or on another multiple of the clock signal. Using a pipelined arrangement of eight F8 clocks, each F8 clock running at 3.5 GHz, to deserializatize the signals on connection 232 instead of, for example, an F2 clock running at 14 GHz, allows the receiver 200 to consume significantly less power and be significantly easier, faster and more cost effective to fabricate because it is far easier to fabricate an F8-based clock and timing network than it is to fabricate an F2-based clock and timing network.

FIG. 5A illustrates the state of the register arrangement 500 when a first clock signal, CLK[0] (FIG. 4A) transitions and loads a first bit (a "0" in this example as shown in FIG. 4B) into the first register location "0" of the register group 504.

FIG. 5B illustrates the state of the register arrangement 500 when a second clock signal, CLK[1] (FIG. 4A) transitions and loads a second bit (a "1" in this example) into the second register location "1" of the register group 504.

FIG. 5C illustrates the state of the register arrangement 500 when a third clock signal, CLK[2] (FIG. 4A) transitions and loads a third bit (a "1" in this example) into the third register location "2" of the register group 504.

FIG. 5D illustrates the state of the register arrangement 500 when a fourth clock signal, CLK[3] (FIG. 4A) transitions and loads a fourth bit (a "0" in this example) into the fourth register location "3" of the register group 504.

FIG. 5E illustrates the state of the register arrangement 500 when a fifth clock signal, CLK[4] (FIG. 4A) transitions and loads a fifth bit (a "1" in this example) into the first register location "4" of the register group 506. At this time, the select signal on connection 511 of the multiplexer 509 causes the contents of the register 504 to be driven onto connection 517. The one-hot load bus, load[4:0], changes so that load[0] is high, and register group 512 of register bank 510 is written with the contents of register group 504.

The select (sel) signal on connection 511 comprises the clock signal, CLK[0]. Effectively, when the data in the register group 504 is stable (implying that the data in register group 506 is changing), the select signal directs the four multiplexers in the multiplexer 509 to pass the data in register group 504 to connection 517. When the data in register group 506 is stable (implying that the data in register group 504 is changing), the select signal on connection 511 directs the four multiplexers in multiplexer 509 to pass the data in register group 506 to connection 517. Combining the function of the select signal on connection 511 with the appropriately moving one-hot load signal from the register bank 530, sequentially loads the register bank 510 alternately with the contents of the register group 504 and the contents of the register group 506.

FIG. 5F illustrates the state of the register arrangement 500 when a sixth clock signal, CLK[5] (FIG. 4A) transitions and loads a sixth bit (a "0" in this example) into the second register location "5" of the register group 506.

FIG. 5G illustrates the state of the register arrangement 500 when a seventh clock signal, CLK[6] (FIG. 4A) transitions and loads a seventh bit (a "0" in this example) into the third register location "6" of the register group 506.

FIG. 5H illustrates the state of the register arrangement 500 when an eighth clock signal, CLK[7] (FIG. 4A) transitions and loads an eighth bit (a "1" in this example) into the fourth register location "7" of the register group 506.

Figures 5I, 5J:
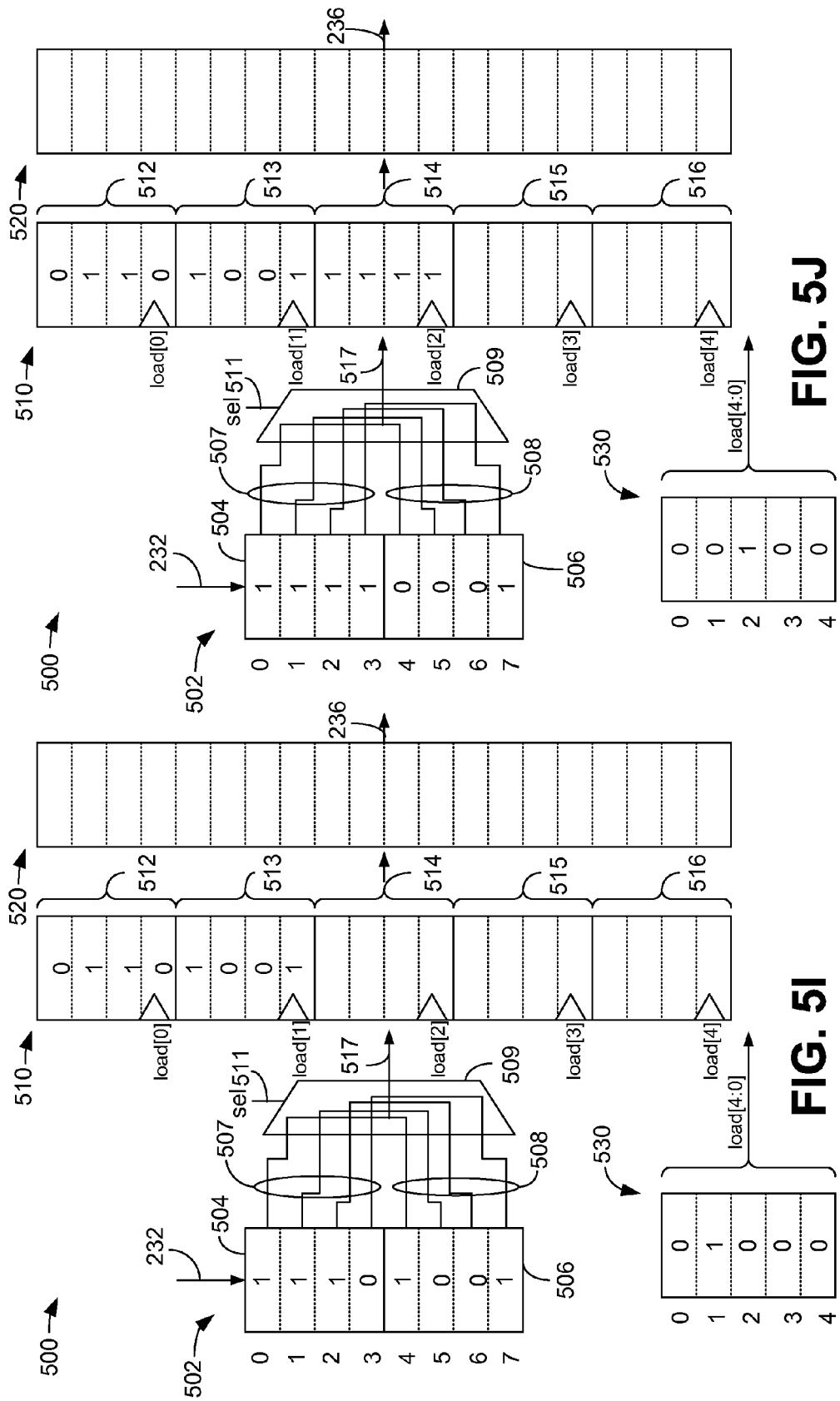

FIG. 5I illustrates the state of the register arrangement 500 when the first clock signal, CLK[0] (FIG. 4A) transitions and loads a first bit (a "1" in this example) into the first register location "0" of the register group 504. At this time, the select signal on connection 511 causes the contents of the register group 506 to be driven onto connection 517. The one-hot load bus, load[4:0], changes so that load[1] is high, and register group 513 of register bank 510 is written with the contents of register group 506.

FIG. 5J illustrates the state of the register arrangement 500 four UI after the state illustrated in FIG. 5I, in which the next four bits have been loaded into the register bank 502, and in which the contents of the register group 504 have been driven onto connection 517. The one-hot load bus, load[4:0], changes so that load[2] is high, and register group 514 of register bank 510 is written with the contents of register group 504.

FIG. 5K illustrates the state of the register arrangement 500 four UI after the state illustrated in FIG. 5J, in which the next four bits have been driven onto connection 517. The one-hot load bus, load[4:0], changes so that load[3] is high, and register group 515 of register bank 510 is written with the contents of register group 506.

FIG. 5L illustrates the state of the register arrangement 500 four UI after the state illustrated in FIG. 5K, in which the next four bits have been driven onto connection 517. The one-hot load bus, load[4:0], changes so that load[4] is high, and register group 516 of register bank 510 is written with the contents of register group 504.

FIG. 5M illustrates the state of the register arrangement 500 four UI after the state illustrated in FIG. 5L, in which the contents of the register bank 510 shown in FIG. 5L have been loaded into the register bank 520. After the contents of the register bank 510 have been loaded into the register bank 520, the one-hot load bus, load[4:0], changes so that load[0] is high, and register group 512 (FIG. 5M) of register bank 510 is written with the contents of register group 506. The contents of the register bank 520 represent 20 bits of parallel data that are output on connection 236 and further processed by the ACE 246 (FIG. 2) and the FEC 242 (FIG. 2).

Figure 6:
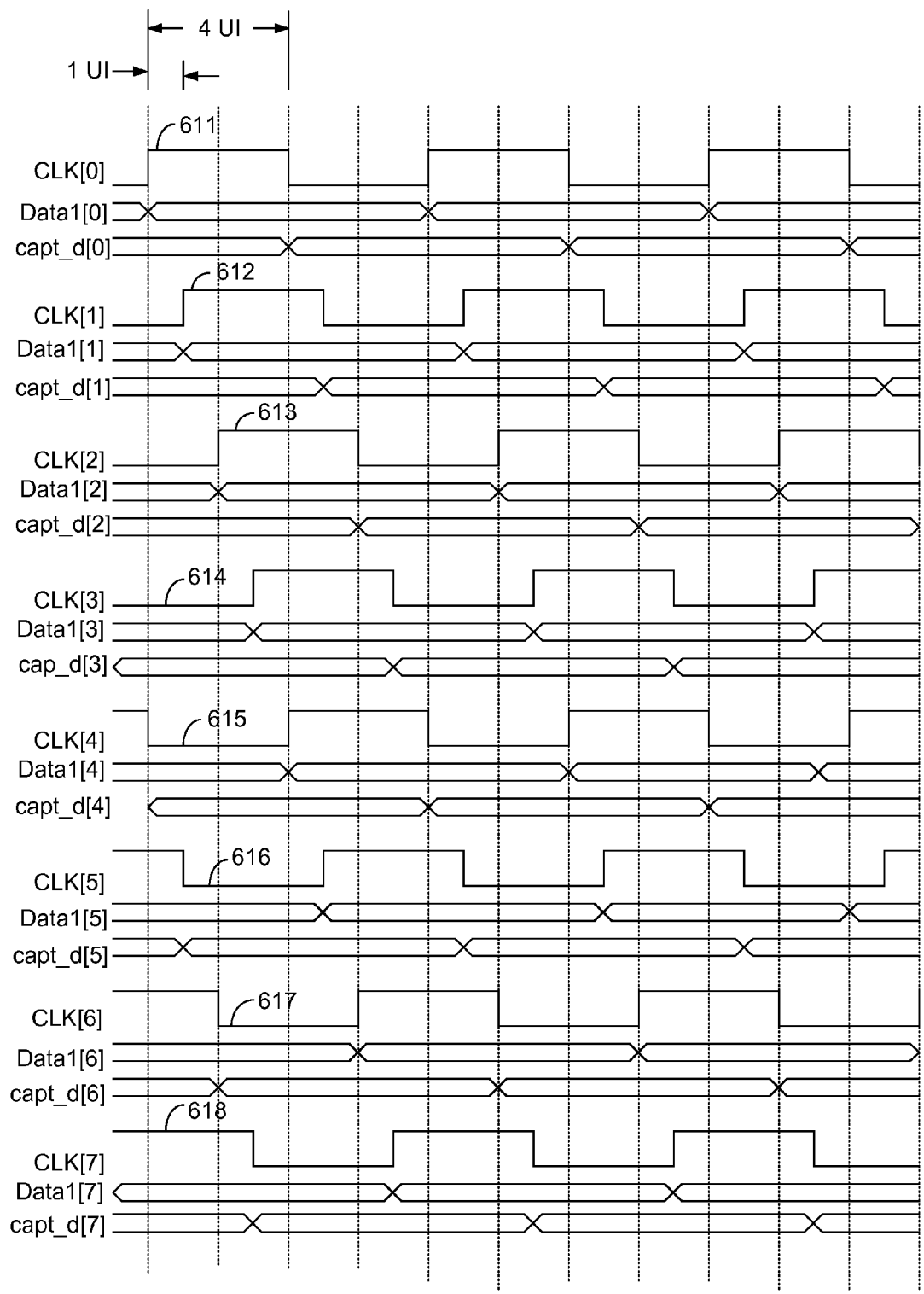
FIG. 6 is a schematic diagram illustrating data transitions associated with the example clock signals of FIG. 3 and FIG. 4A.

FIG. 6 is a schematic diagram illustrating data transitions associated with the example clock signals of FIG. 3 and FIG. 4A. FIG. 6 shows how the data is captured (capt_d[7:0]) using the falling edge of each clock, CLK[0] (611) through CLK[7] (618) or in other words, the clock edge that didn't change when the data (Data0[7:0], Data1[7:0], or Test[7:0]) arrived at the serial-to-parallel converter 234 (FIG. 2).

Figure 7:
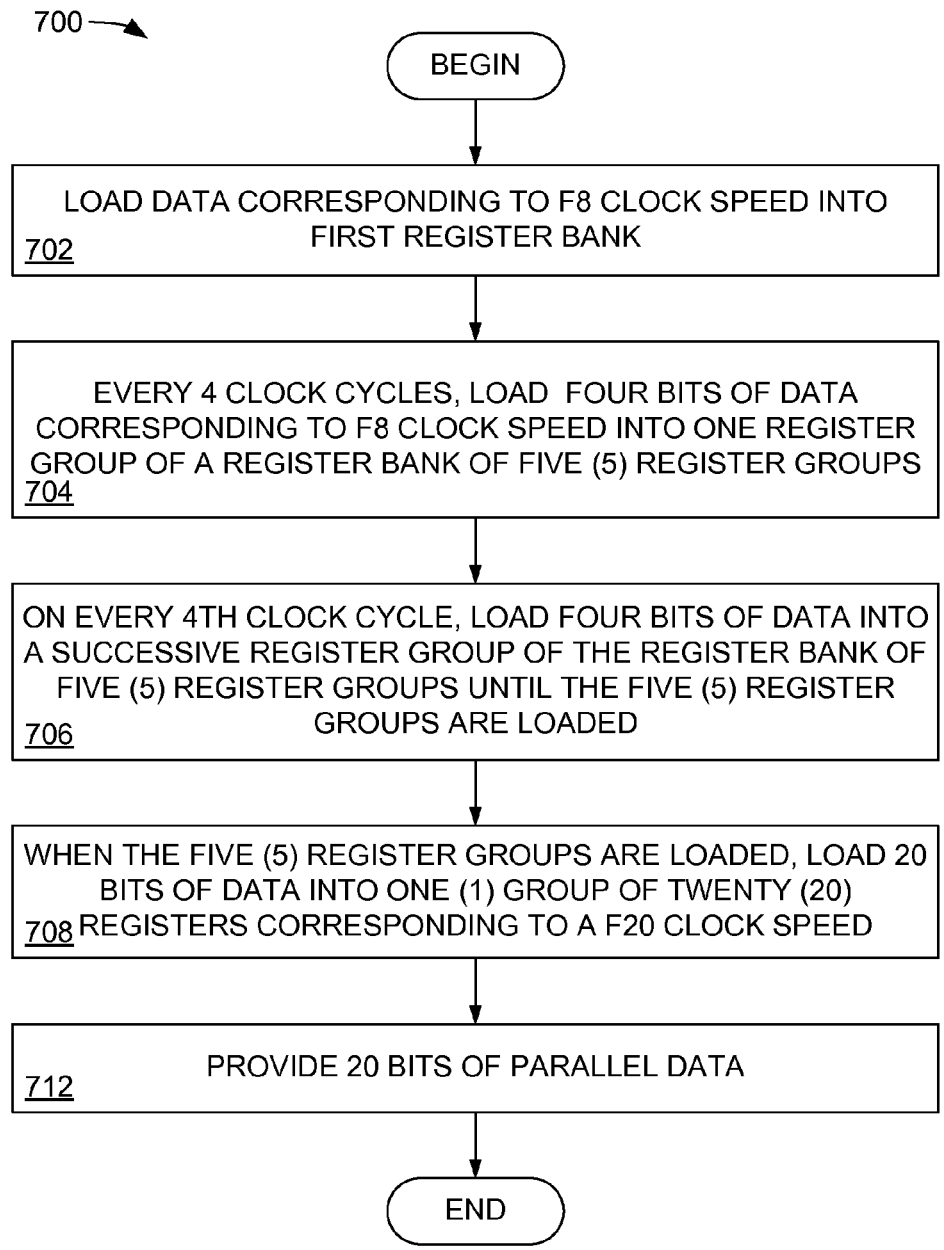
FIG. 7 is a flow chart describing an embodiment of a method for high-speed data parallelization for an N-phase receiver.

FIG. 7 is a flow chart describing an embodiment of a method for high-speed data parallelization for an N-phase receiver. The blocks in the flow chart 700 can be performed in or out of the order shown.

In block 702, the register groups 504 and 506 are loaded with eight (8) bits of data at a rate corresponding to an F8 clock speed.

In block 704, every four UI, four (4) bits of data are loaded into one of the register groups of the register bank 510.

In block 706, every four UI, four (4) additional bits of data are loaded into a successive one of the register groups of the register bank 510 until the five (5) groups of four (4) registers are loaded with 20 bits of data.

In block 708, when the five (5) groups of four (4) registers in the register bank 510 are loaded, load 20 bits of data into one (1) group of 20 registers in the register bank 520.

In block 712, 20 bits of parallel data are provided from the register bank 520 at a rate corresponding to a F20 clock speed.

This disclosure describes the invention in detail using illustrative embodiments. However, it is to be understood that the invention defined by the appended claims is not limited to the precise embodiments described.

What is claimed is:

1. A serial-to-parallel converter, comprising:
a first register bank having first and second register groups, the first register bank configured to receive a communication signal having at least one bit for each unit interval (UI) of a system clock signal, the first register bank having a number of registers corresponding to a number of parallel processing stages;
a second register bank having a plurality of register groups, each register group configured to receive the output of at least one of the first and second register groups after a number of unit intervals corresponding to the number of registers in each of the first and second register groups in the first register bank; and
a third register bank configured to receive the output of the second register bank after a number of unit intervals corresponding to a number of registers in the second register bank.

2. The serial-to-parallel converter of claim 1, further comprising eight (8) parallel processing stages, wherein an input clock signal corresponds to an F8 clock speed.

3. The serial-to-parallel converter of claim 2, wherein an output of the third register bank is a 20 bit word corresponding to an F20 clock speed.

4. The serial-to-parallel converter of claim 3, wherein the first register bank comprises eight (8) registers.

5. The serial-to-parallel converter of claim 3, wherein the second register bank comprises five (5) groups of four (4) registers.

6. The serial-to-parallel converter of claim 3, wherein the third register bank comprises twenty (20) registers.

7. The serial-to-parallel converter of claim 3, wherein a first register group of the second register bank is loaded with the contents of at least one of the first and second register groups of the first register bank on the same clock cycle during which the third register bank is loaded with the contents of the five (5) groups of four (4) registers of the second register bank.

8. The serial-to-parallel converter of claim 3, further comprising a fourth register bank arranged in a one hot configuration, the fourth register bank comprising five registers, one of which causes the output of at least one of the first and second register groups to be sequentially loaded into a register group of the second register bank.

9. The serial-to-parallel converter of claim 8, wherein the fourth register bank comprises one register for each register group in the second register bank.

10. A method for serial-to-parallel conversion, comprising:
loading data sequentially into a first register bank at a speed corresponding to an F8 clock;
every four clock cycles, loading four bits of data from the first register bank into one of five register groups of a second register bank;
every fourth clock cycle, loading four bits of data into a successive register group of the second register bank until the five register groups are loaded with twenty (20) bits of data; and
loading the twenty (20) bits of data into a third register bank having one (1) group of twenty (20) registers, the twenty (20) bits of data loaded into the third register bank at a speed corresponding to an F20 clock.

11. The method of claim 10, wherein loading data sequentially into the first register bank comprises loading the data into eight registers over eight clock cycles.

12. The method of claim 11, further comprising implementing each of the five register groups of the second register bank using four (4) registers.

13. The method of claim 12, further comprising loading a first register group of the second register bank with the contents of at least one of the first and second register groups of the first register bank on the same clock cycle during which the third register bank is loaded with the contents of the five (5) groups of four (4) registers of the second register bank.

14. The method of claim 13, further comprising implementing a fourth register bank in a one hot configuration, the fourth register bank comprising five registers, each register in the fourth register group corresponding to one register group in the second register bank, one register of the fourth register group causing the output of at least one of the first and second register groups to be sequentially loaded into a register group of the second register bank.

15. A receiver having parallel processing stages, comprising:
   a plurality of equalizers having parallel processing stages, the plurality of equalizers configured to process a received data signal and develop a communication signal having a plurality of data bits each data bit separated in time by one unit interval of a system clock;
   a serial-to-parallel converter configured to receive the communication signal, the serial-to-parallel converter comprising;
      a first register bank having first and second register groups, the first register bank configured to receive the communication signal the first register bank having a number of registers corresponding to the number of parallel processing stages;
      a second register bank having a plurality of register groups, each register group configured to receive the output of the first and second register groups after a number of unit intervals corresponding to the number of registers in each of the first and second register groups in the first register bank; and
      a third register bank configured to receive the output of the second register bank after a number of unit intervals corresponding to the size of the second register bank.

16. The receiver of claim 15, further comprising eight (8) parallel processing stages, wherein an input clock signal corresponds to an F8 clock speed.

17. The receiver of claim 16, wherein an output of the third register bank is a 20 bit word corresponding to an F20 clock speed.

18. The receiver of claim 17, wherein the first register bank comprises eight (8) registers.

19. The receiver of claim 17, wherein the second register bank comprises five (5) groups of four (4) registers.

20. The receiver of claim 17, wherein the third register bank comprises twenty (20) registers.

21. The receiver of claim 17, wherein a first register group of the second register bank is loaded with the contents of at least one of the first and second register groups of the first register bank on the same clock cycle during which the third register bank is loaded with the contents of the five (5) groups of four (4) registers of the second register bank.

22. The receiver of claim 17, further comprising a fourth register bank arranged in a one hot configuration, the fourth register bank comprising five registers, one of which causes the output of at least one of the first and second register groups to be sequentially loaded into a register group of the second register bank.

23. The receiver of claim 22, wherein the fourth register bank comprises one register for each register group in the second register bank.

* * * * *